United States Patent
Watanabe et al.

[11] Patent Number: 6,020,649
[45] Date of Patent: Feb. 1, 2000

[54] PLASTIC MOLDED SEMICONDUCTOR PACKAGE AND A METHOD FOR PRODUCING THE SAME

[75] Inventors: Norinaga Watanabe; Shinichi Nishi, both of Yokohama, Japan

[73] Assignee: Kabushiki Kaisha Gotoh Seisakusho, Yikohama, Japan

[21] Appl. No.: 08/884,504

[22] Filed: Jun. 27, 1997

[30] Foreign Application Priority Data

Jun. 28, 1996 [JP] Japan ................................ 8-188283

[51] Int. Cl.[7] .................................................. H01L 23/48
[52] U.S. Cl. ...................... 257/796; 257/718; 257/706
[58] Field of Search ................................. 257/718, 714, 257/706, 707, 746

[56] References Cited

U.S. PATENT DOCUMENTS

| | | | |
|---|---|---|---|
| 5,387,554 | 2/1995 | Liang | 438/122 |
| 5,455,462 | 10/1995 | Marrs . | |
| 5,763,296 | 6/1998 | Casati et al. | 438/122 |
| 5,770,479 | 6/1998 | Brooks et al. | 438/122 |
| 5,798,570 | 8/1998 | Watanabe et al. | 257/796 |
| 5,886,396 | 3/1999 | Carney et al. | 438/122 |

FOREIGN PATENT DOCUMENTS 6-5746  8/1993  Japan .

Primary Examiner—Kevin M. Picardat
Attorney, Agent, or Firm—Jacobson, Price, Holman & Stern, PLLC

[57] ABSTRACT

In construction of a plastic molded semiconductor package provided with a heat sink and electrically conductive leads attached to the periphery of the heat sink, a conventional electrically insulating, adhesive bonding tape is replaced by a non-adhesive insulating sheet and support bars are locally provided in a lead frame between the leads. For uniting the leads to the heat sink, the support bars are fixed to the heat sink whilst sandwiching the insulating sheet. No use of the adhesive bonding tape greatly reduces intrusion of contaminants into the package, simplifies the production process and lowers the production cost.

5 Claims, 5 Drawing Sheets

PLASTIC MOLDED SEMICONDUCTOR PACKAGE AND A METHOD FOR PRODUCING THE SAME

BACKGROUND OF THE INVENTION

The present invention relates to a plastic molded semiconductor package and a method for producing the same, and more particularly relates to improvements in operational reliability and production cost of a plastic molded semiconductor package provided with a heat sink.

In the case of a semiconductor package in which a semiconductor die provided with an integrated circuit is encapsulated in a plastic package, a metallic heat sink is incorporated in the plastic package in order to promote effective dissipation of heat from the semiconductor die. For example, Japanese Patent Opening Hei. 6-5746 discloses a semiconductor package provided with a heat sink partially exposed outside a plastic package. The heat sink supports on its first surface a semiconductor die at a location sufficiently distant from the outer surface of the plastic package, and exposes its second surface opposite to the first surface outside the plastic package. A plurality of electrically conductive leads are mounted onto the first surface in an arrangement juxtaposed along the outer periphery of the heat sink, and these leads are united to the heat sink via an electrically insulating bonding tape. During production of the semiconductor package, the heat sink is bonded to the plurality of leads in a lead frame via the electrically insulating bonding tape.

In the case of the semiconductor package of this prior art, however, use of the electrically insulating bonding tape for uniting of the leads with the heat sink is accompanied with various problems as set out below.

First, relatively high degree of humidity absorption of by bonding agents generally used for the bonding tape tends to allow easy intrusion of outside contaminants into the plastic package, thereby seriously lowering operational reliability of the semiconductor package.

Second, thermal hardening of the bonding agent and dry cleaning of the bonding areas of the leads are additionally necessary in production of the semiconductor package. Generally, the thermal hardening is performed after uniting the heat sink to the lead frame. During this thermal hardening, gas is generated from the bonding agent and adheres as a contaminant to the surfaces of the leads for connection with the bonding wires. The contaminant tends to cause defective connection of the bond wires. In order to avoid such troubles, it is necessary to perform the above-described dry cleaning of the bonding areas of the leads.

Third, connection of the bonding wires tends to cause thermal softening of the bonding agent. Soft bonding agent allows sinking of the leads into the layer of the bonding agent during the process of connection, which causes defective connection of the bonding wires.

Fourth, the electrically insulating bonding tape is relatively expensive and, as a consequence, its use induces rise in production cost.

SUMMARY OF THE INVENTION

It is thus the basic object of the present invention to avoid use of bonding tapes for connection of a lead frame to a heat sink, thereby enhancing operational reliability and production cost of a semiconductor package.

In accordance with the basic aspect of the present invention, a non-adhesive, electrically insulating sheet is interposed between inner end sections of leads and a lead supporting surface of a heat sink. Because the insulating sheet has no function of bonding, several support bars are provided locally between the juxtaposed leads in the construction of the lead frame and such support bars are united with the heat sink whilst clamping the insulating sheet. In production of the semiconductor package in accordance with the present invention, the heat sink is supported by the lead frame via the support bars. Since no bonding tape of high humidity absorption is used, undesirable intrusion of contaminants into the plastic package can be well prevented to enhance operational reliability of the semiconductor package. Because no thermal hardening of bonding agent is necessary, contamination of the bonding area of the leads and resultant defective connection can be well prevented. The additional dry cleaning needs not to be performed. Because no bonding agent is present between the lead and the heat sink, no undesirable sinking of the leads at connection of the bonding wires starts and, as a consequence, defective connection of the bond wires can be well avoided. Further, no use of the expensive bonding tapes significantly lowers the production cost of the semiconductor package.

DESCRIPTION OF THE PREFERRED EMBODIMENTS

Figure 1:
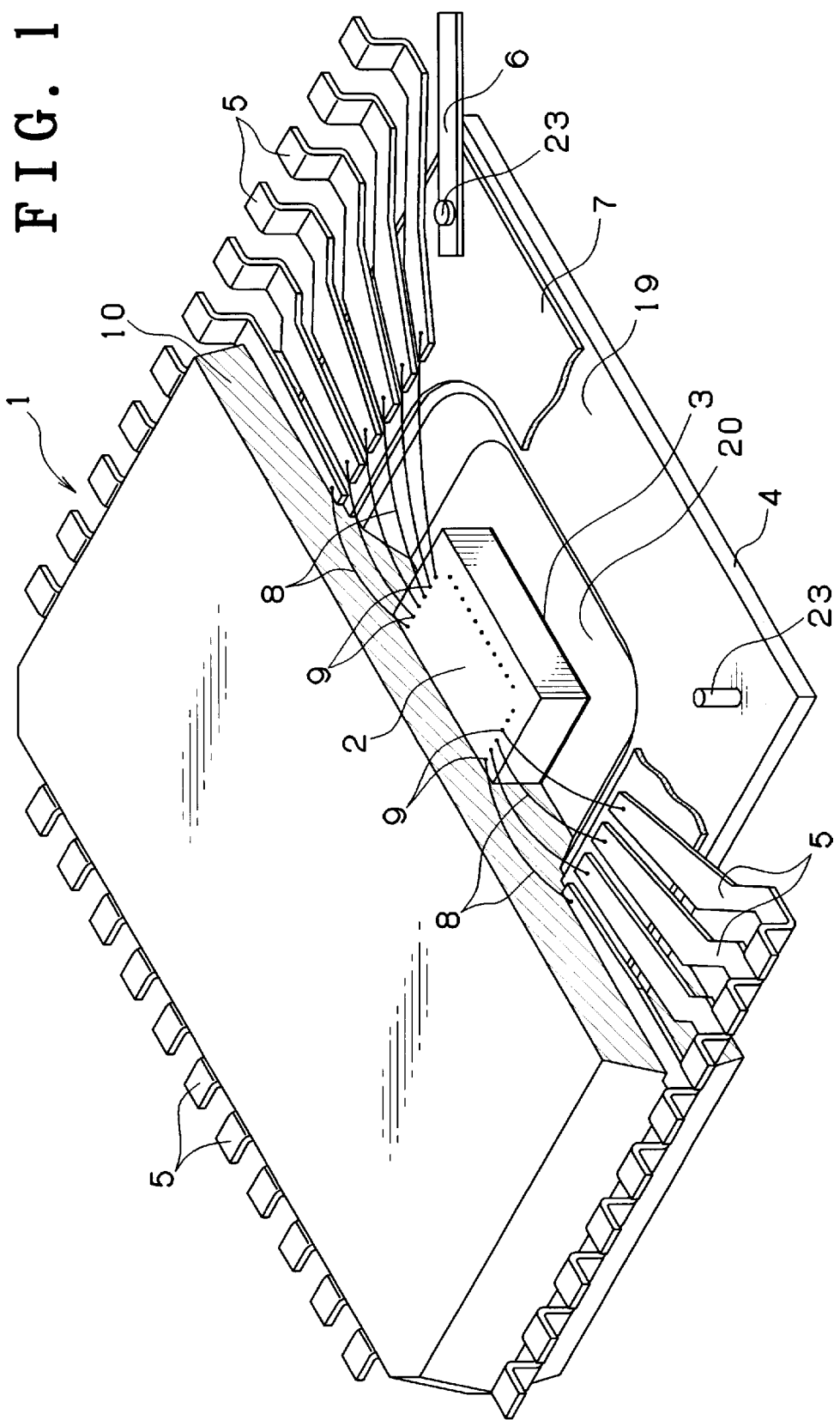
FIG. 1 is a perspective view, partly cut off for better understanding, of one embodiment of the semiconductor package in accordance with the present invention.

One embodiment of the semiconductor package in accordance with the present invention is shown in FIG. 1, in which a semiconductor package 1 is provided with a semiconductor die 2 bonded onto a heat sink 4 via a thermally conductive adhesive 3. A plurality of leads 5 and several support bars 6 are juxtaposed around the heat sink 4 whilst extending outwards. Although the heat sink 4 is provided with the leads 5 on its four sides in the case of the illustrated arrangement, the leads 5 may be provided on 3 or less sides too. The leads 5 and the support bars 6 are coupled to the heat sink 4 via an electrically insulating sheet 7. The support bars 6 are arranged on the four corners of the heat sink 4 so that their inner ends are fixed onto the heat sink 4 to clamp the insulating sheet 7. Electrically conductive bond wires 8 are used to connect the inner ends of the lead 5 to selected group of contact pads 9 arranged on the semiconductor die 2. Encapsulating plastic 10 covers the heat sink 4, the semiconductor die 2, bond wires 8, the inner end sections of the leads 5 and the support bars 6. Though not illustrated in the drawing, the surface of the heat sink 4 opposite to the semiconductor die 2 is exposed outside the encapsulating plastic 10.

Figure 2:
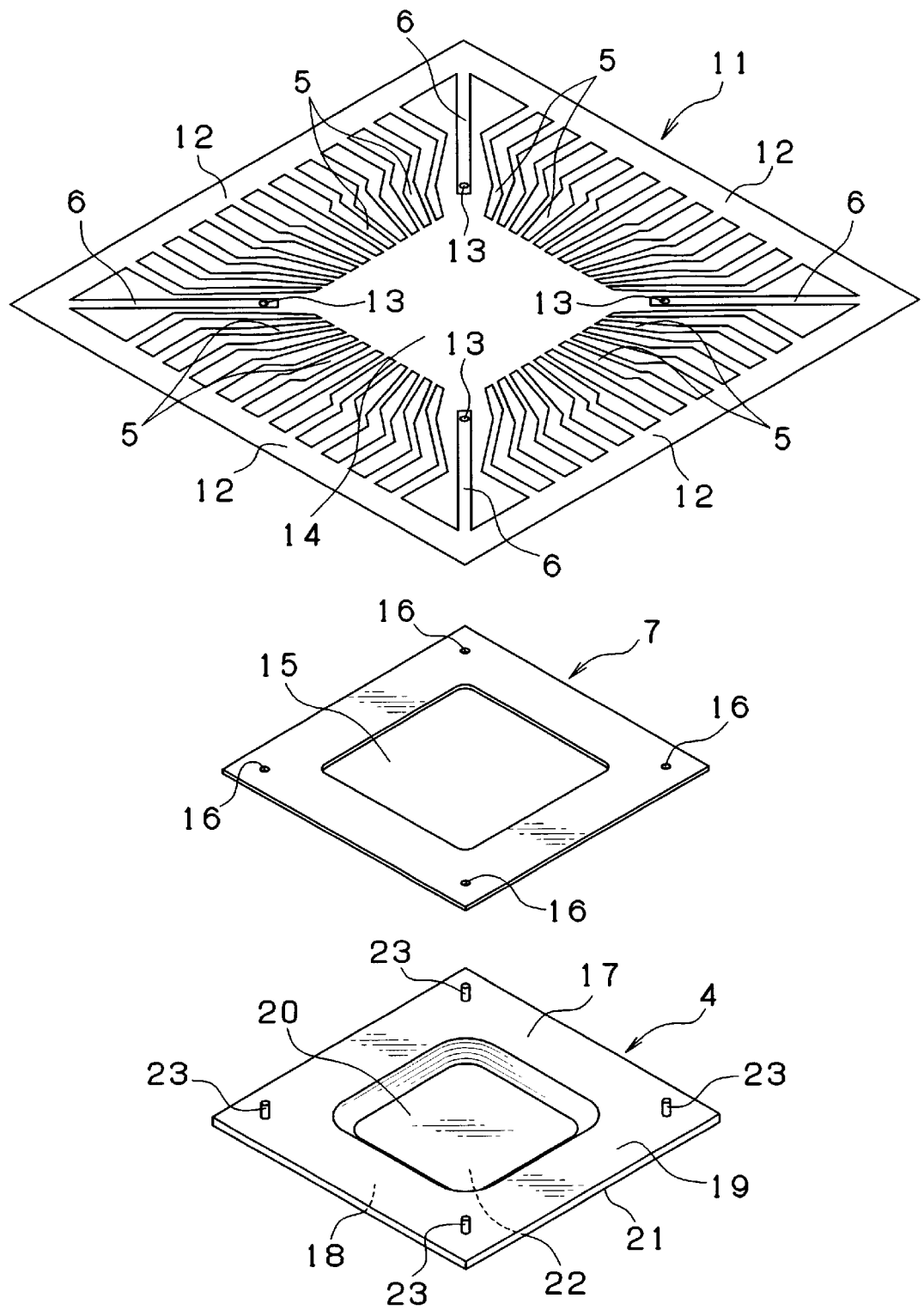
FIG. 2 is a perspective view of a lead frame, an electrically insulating sheet and a heat sink before assembly.

The semiconductor package 1 shown in FIG. 1 is produced for example in the following manner. FIG. 2 depicts a lead frame 11, a insulating sheet 7 and a heat sink 4 to be assembled together in the later phase of production. The lead frame 11 includes a plurality of leads 5 and several support bars 6 connected to each other at outer ends by an outer gallery 12. A through hole 13 is formed in the inner end of each support bar 6. The lead frame 11 is made of various metals which are generally known in the field of art as materials for making lead frames. The lead frame 11 is flat in configuration and formed by die cutting or etching from a metallic plate. Although a square outer gallery 12 and a square center opening 14 are employed in the case of the illustrated embodiment, any configuration can be adopted in accordance with the design and size of the heat sink to be united to the lead frame.

The insulating sheet 7 is formed by die cutting from a synthetic resin sheet of electrically insulating nature. The insulating sheet 7 is given in the form of a square gallery having a center opening 15 somewhat smaller than the center opening 14 in the lead frame 11. Through holes 16 are formed in the four corners of the insulating sheet 7. Because the insulating sheet 7 of the present invention is not covered with adhesive, its production cost is relatively low.

The heat sink 4 is made of a relatively thin plate of a metallic material of high thermal conductivity such as aluminum via press shaping. The heat sink 4 is substantially square in shape and provided with the first surface 17 and an opposite second surface 18. The first surface 17 is provided with central die receptive surface 20 and a lead receptive surface 19 surrounding the die receptive surface 19. In the case of the illustrated example, the die receptive surface 20 is given in the form of a recess parallel to the plane of the lead receptive surface 19. However, the die receptive surface 20 may be coplanar with the lead receptive surface 19. The die receptive surface 20 is square in shape somewhat smaller than the center opening 15 in the insulating sheet 7. A surface 22 of the heat sink 4 opposite to the die receptive surface 20 is exposed outside the encapsulating plastic 10 for dissipation of heat generated at the heat sink 4.

The heat sink 4 provided with such an exposed surface can be produced from a thin plate material which can be stocked in the form of a large roll. Such a mode of stock is well suited for continuous processing. Supply of the material in the form of a thin plate assures very easy shaping. The configuration of the heat sink 4 provides a long boundary with the encapsulating plastic 10, which well resists against undesirable intrusion of outside contaminants along the boundary. Any configuration may be, however, designed quite freely for the heat sink 4. At each corner of the heat sink 4, the lead receptive surface 19 is provided with a projection 23. The projections 23 are arranged to correspond in position to the through holes 13 in the support bars 6 and the through holes 16 in the insulating sheet 7.

Figure 3:
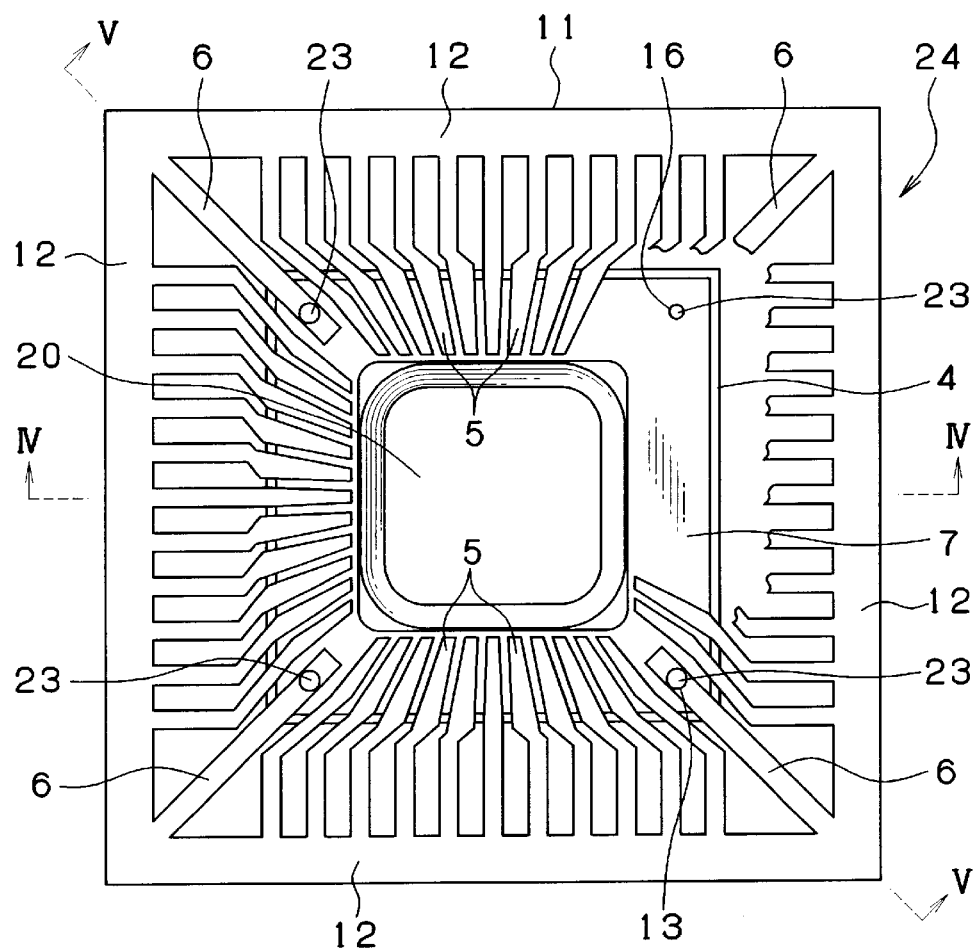
FIG. 3 is a top plan view of a lead frame assembly partly cut off for better understanding.
Figure 4:
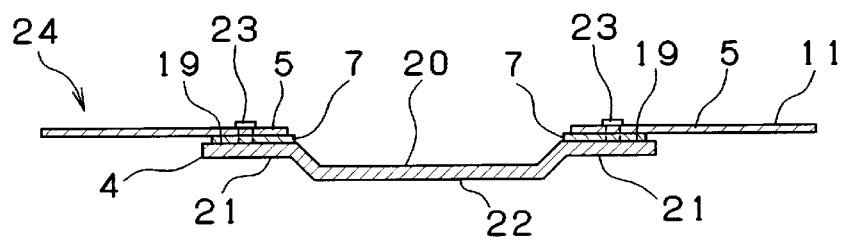
FIG. 4 is a sectional side view taken along a line IV—IV in FIG. 3.
Figure 5:
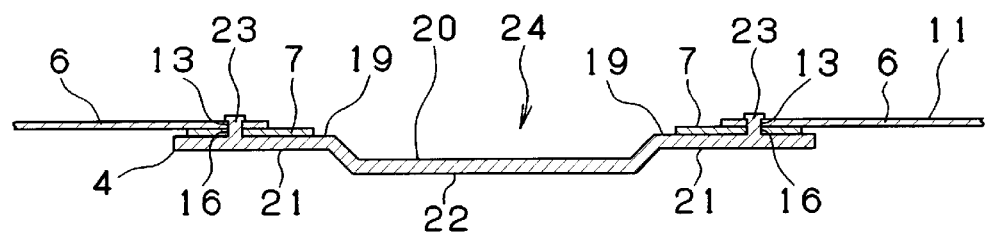
FIG. 5 is a sectional side view taken along a line V—V in FIG. 3.

In the arrangements shown in FIGS. 3 to 5, the lead frame 11, the insulating sheet 7 and the heat sink 4 are combined in one body together to form a lead frame assembly 24. The insulating sheet 7 is placed on the lead receptive surface 19 of the heat sink 4 and the projections 23 are put into engagement with the through holes 16.

The inner end sections of the leads 5 and the support bars 6 are placed on the insulating sheet 7 and the projections 23 of the heat sink 4 are inserted into the through holes 13 in the support bars 6. Heads of the projections 23 are crashed to unite the lead frame 11, the insulating sheet 7 and the heat sink 4 together. In this united position, the heat sink 4 is supported by the lead frame 11 via the support bars 6. Because the heat sink 4 is made of a thin metallic plate and light in weight, there is little danger of support bar deformation.

Figure 6:
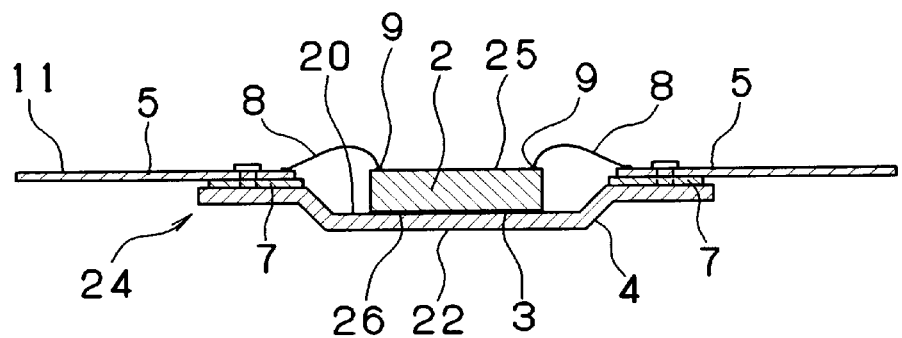
FIG. 6 is a sectional side view of a semiconductor die mounted to a lead frame and connected with bond wires.

Now, in the arrangement of the lead frame assembly 24 shown in FIG. 6, the semiconductor die 2 is placed on the die receptive surface 20 of the heat sink 4. The semiconductor die 2 is provided with the first surface 25 and the second surface 26 opposite to the first surface 25. A plurality of electrically conductive contact pads 9 are arranged on the first surface 25 of the semiconductor die 2 whereas the semiconductor die 2 is bonded at the second surface 26 to the die receptive surface 20 of the heat sink 4 via conductive adhesive 3. Each of a plurality of electrically conductive bond wires 8 is connected at one end to one of the contact pads 9 on the semiconductor die 2 and, at the other end, to one of the leads 5 on the lead frame 11. Because the leads 5 are directly supported on the insulating sheet 7 of low elastic nature without any adhesive, they move very little during connection of the bond wires 8, thereby assuring reliable and smooth connection.

Figure 7:
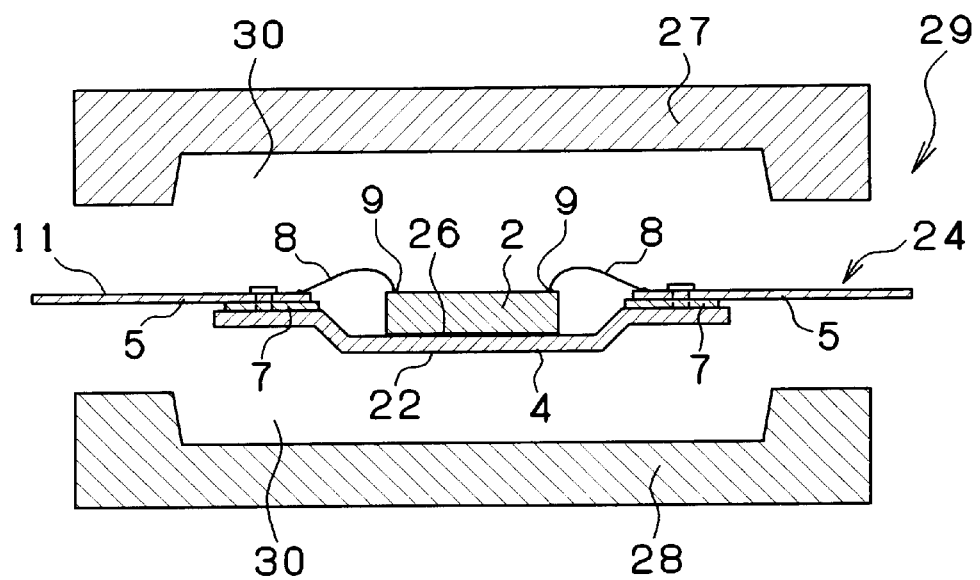
FIG. 7 is a sectional side view of molding process of encapsulating plastic.

Next, referring to FIG. 7, the lead frame assembly 24 bearing the semiconductor die 2 is placed in position in a mold cavity 30 of a mold unit 29 made up of mold halves 27 and 28. After closing the mold halves 27 and 28, the encapsulating plastic 10 is filled into the mold cavity 30. When the mold halves 27, 28 are closed, the exposed surface 22 of the heat sink 4 is put into pressure contact with the wall of the mold cavity 30. By filling of the encapsulating plastic 10, the heat sink 4, the semiconductor die 2, the inner end sections of the leads 5, insulating sheet 7 and bond wires 8 are covered with the encapsulating plastic 10 whereas the surface 22 of the heat sink 4, the outer end sections of the leads 5 and the outer end sections of the support bars 6 are exposed outside the encapsulating plastic 10. After solidification by cooling, the mold unit 29 is made open and the semiconductor package 1 is taken out of the mold unit 29. Thereafter, the outer gallery 12 of the lead frame 11 is cut and removed to separate the leads 5 and the support bars 6 from each other. The support bars 6 do not project outside the encapsulating plastic 10. When necessary, the outer ends of the leads 5 may be bent properly outside the encapsulating plastic 10.

Figure 8:
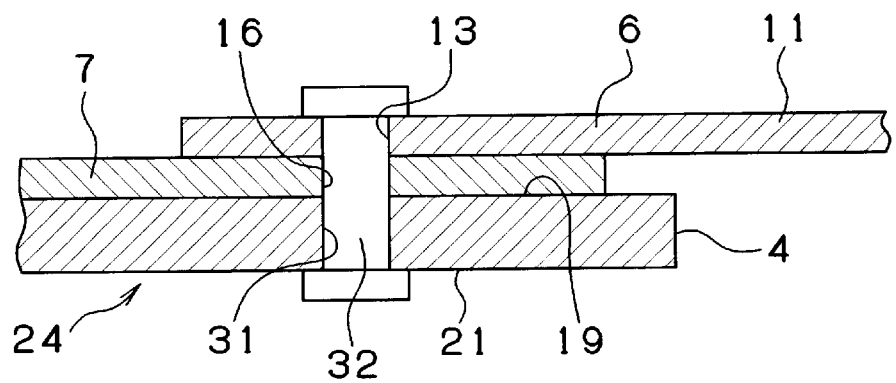
FIG. 8 is a sectional side view of another formation of the lead frame.

Another embodiment of combination of the lead frame 11, the insulating sheet 7 and the heat sink 4 is shown in FIG. 8, in which through holes 31 are formed in the heat sink 4 at positions corresponding to the through holes 13 in the lead frame 11 and the through holes 16 in the heat sink 4 as a substitute for the projections and a rivet 32 is inserted into each group of the through holes 13, 16 and 31. Thereafter the heads of the rivet 32 are crashed to unite the lead frame 11, the insulating sheet 7 and the heat sink 4 together.

Figure 9:
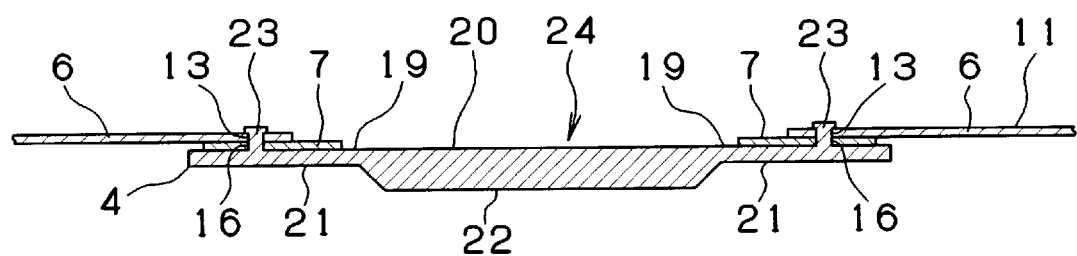
FIG. 9 is a sectional side view of a lead frame assembly provided with a different type of heat sink.

In the case of the embodiment shown in FIG. 9, the die receptive surface 20 is formed coplanar with the lead receptive surface 19 in the construction of the heat sink 4. The above-described depressed configuration of the die receptive surface 20 limits the size of the semiconductor die 2 to be placed thereon and, as a consequence, the heat sink 4 needs to be shaped in accordance with the size of the semiconductor die 2 to be combined therewith. The coplanar configuration of the both surfaces 19 and 20 broadens size range of the semiconductor die 2 to be combined. Stated otherwise, the coplanar configuration of this embodiment can span a wide range of semiconductor die size. The opposite surface 22 in this embodiment is somewhat bulges to provide an elongated boundary with the encapsulating plastic 10, thereby well resisting against undesirable intrusion of outer contaminants along the boundary.

In accordance with the present invention, non-adhesive electrically insulating sheet is interposed between the inner end sections of the leads and the lead receptive surface of the heat sink. The support bars are locally provided in the lead frame between juxtaposed leads, the heat sink and the insulating sheet are united together via the support bars. In the production process in accordance with the present invention, the heat sink is supported by the lead frame via the support bars. Since no bonding tape of relatively high humidity absorption is used for combination of the elements, intrusion of contaminant associated with humidity absorption can be prevented very effectively, thereby raising operational reliability of the semiconductor package. Because no thermal solidification of adhesive is necessary in production, ill lead connection to be otherwise caused by contamination of the lead bonding are can be evaded. It is no longer necessary to employ additional dry cleaning process. Since no adhesive is present between the leads and the heat sink, the leads can be stable held during connection of the bond wires thereto and, as a consequence, defective connection between the two elements can be prevented. The production cost can be much reduced through no use of expensive bonding tapes.

We claim:

1. A plastic molded semiconductor package comprising:

a heat sink having a first surface with a central die receptive surface, a peripheral lead receptive surface, and a second surface opposite to said first surface, a semiconductor die coupled to said die receptive surface of said heat sink and provided with a plurality of electrically conductive contact pads, a plurality of juxtaposed, electrically conductive leads attached at inner end sections to said lead receptive surface of said heat sink, an electrically insulating sheet present between said inner end sections of said leads and said lead receptive surface of said heat sink, a plurality of electrically conductive bond wires each connected at one end to one of said contact pads and at another end to one of said inner end sections of said leads, and an encapsulating plastic covering said heat sink, said semiconductor die, said inner sections of said leads, said insulating sheet and said bond wires whilst exposing said second surface of said heat sink.

2. A plastic molded semiconductor package comprising:

a heat sink provided with a first surface, a second surface opposite to and parallel to said first surface, a lead receptive surface in a peripheral section of said first surface and a die receptive surface in a section surrounded by said lead receptive surface, said second surface being at least locally provided with an exposed surface, a semiconductor die provided with a first surface having a plurality of contact pads and an opposite second surface, said second surface being attached onto said die receptive surface of said heat sink, adhesive for bonding said second surface of said semiconductor die to said die receptive surface on said first surface of said heat sink, a plurality of electrically conductive leads provided with inner and outer end sections, said inner end sections being supported on said lead receptive surface on said first surface of said heat sink, an electrically insulating sheet interposed between said inner end sections of said leads and said lead receptive surface of said heat sink, a plurality of electrically conductive bond wires each connecting one of said contact pads to one of said leads, and an encapsulating plastic covering said heat sink, said semiconductor die, said adhesive, said inner end sections of said leads and said insulating sheet whilst exposing said exposed surface on said second surface of said heat sink.

3. A plastic molded semiconductor package comprising:

a heat sink provided with a first surface, a second surface opposite to and parallel to said first surface, a lead receptive surface in a peripheral section of said first surface and a die receptive surface in a section surrounded by said lead receptive surface, said second surface having an exposed surface, a semiconductor die provided with a first surface having a plurality of contact pads and an opposite second surface, said second surface attached to said die receptive surface of said heat sink, adhesive for bonding said second surface of said semiconductor die to said die receptive surface on said first surface of said heat sink, a plurality of electrically conductive leads provided with inner and outer end sections, said inner end sections being supported on said lead receptive surface on said first surface of said heat sink, support bars supported on said lead receptive surface on said first surface of said heat sink, a non-adhesive, electrically insulating sheet interposed between said inner end sections of said leads, said support bars and said lead receptive surface of said heat sink, a plurality of electrically conductive bond wires each connecting one of said contact pads to one of said leads, and an encapsulating plastic covering said heat sink, said semiconductor die, said adhesive, said inner end sections of said leads, said insulating sheet and said bond wires whilst exposing said exposed surface on said second surface of said heat sink, said support bars being united to said heat sink whilst sandwiching said insulating sheet.

4. The semiconductor package as claimed in claim 3 wherein said support bars are provided with through holes, said insulating sheet is provided with through holes in alignment with said through holes of said support bars, said heat sink is provided with projections which are inserted into said through holes in said support bars and said insulting sheet, and said support bars and said heat sink are combined together via crashed heads of said projections.

5. The semiconductor package as claimed in claim 3 wherein said support bars are provided with through holes, said insulating sheet is provided with through holes in alignment with said through holes of said support bars, rivets are inserted into said through holes in said support bars and said insulting sheet, and said support bars and said heat sink are combined together via crashed heads of said rivets.

* * * * *